United States Patent
Tada et al.

(10) Patent No.: US 7,909,959 B2
(45) Date of Patent: Mar. 22, 2011

(54) METHOD FOR RELEASING ADHERED ARTICLE

(75) Inventors: Toshio Tada, Kobe (JP); Yohei Nishimura, Mishima-gun (JP); Katsunori Toyoshima, Mishima-gun (JP); Juichi Fukatani, Koka-gun (JP); Tadahiko Yoshioka, Koka-gun (JP)

(73) Assignee: Sekisui Chemical Co., Ltd., Osaka-shi (JP)

( * ) Notice: Subject to any disclaimer, the term of this patent is extended or adjusted under 35 U.S.C. 154(b) by 1118 days.

(21) Appl. No.: 10/553,177

(22) PCT Filed: Apr. 14, 2004

(86) PCT No.: PCT/JP2004/005291
§ 371 (c)(1),
(2), (4) Date: Feb. 3, 2006

(87) PCT Pub. No.: WO2004/092292
PCT Pub. Date: Oct. 28, 2004

(65) Prior Publication Data
US 2006/0144515 A1    Jul. 6, 2006

(30) Foreign Application Priority Data

Apr. 14, 2003 (JP) ................ 2003-109355
Apr. 14, 2003 (JP) ................ 2003-109356
Jul. 18, 2003 (JP) ................ 2003-276832
Jul. 18, 2003 (JP) ................ 2003-276833

(51) Int. Cl.
*B32B 38/10* (2006.01)
(52) U.S. Cl. .................................... 156/344
(58) Field of Classification Search .............. None
See application file for complete search history.

(56) References Cited

U.S. PATENT DOCUMENTS

| 5,009,746 | A | | 4/1991 | Hossain et al. | |
|---|---|---|---|---|---|
| 5,462,973 | A | * | 10/1995 | Serad et al. | 521/62 |
| 5,501,761 | A | * | 3/1996 | Evans et al. | 156/344 |
| 6,306,564 | B1 | * | 10/2001 | Mullee | 430/329 |
| 6,383,647 | B1 | * | 5/2002 | Shohi et al. | 428/437 |

FOREIGN PATENT DOCUMENTS

| JP | 05-047732 | 2/1993 |
|---|---|---|
| JP | 6-80945 | 3/1994 |
| JP | 6-219793 | 8/1994 |
| JP | 6-247751 | 9/1994 |
| JP | 3137504 | 12/1994 |
| JP | 9-227957 | 9/1997 |
| JP | 10-237215 | 9/1998 |
| JP | 10-237215 A | 9/1998 |
| JP | 2000-10116 A | 4/2000 |
| JP | 2001-235718 | 2/2001 |
| JP | 2001-104928 | 4/2001 |
| JP | 2001-235718 A | 8/2001 |
| JP | 2002-126562 A | 5/2002 |
| JP | 2002-155162 | 5/2002 |
| JP | 2002-155162 A | 5/2002 |
| JP | 2002-177922 | 6/2002 |
| JP | 2002-177922 A | 6/2002 |
| JP | 2002-233847 A | 8/2002 |
| JP | 2002-343760 | 11/2002 |
| JP | 2003-160688 | 6/2003 |
| JP | 2003-285042 | 10/2003 |

OTHER PUBLICATIONS

Ethylene-vinyl acetate copolymer, Chemical Book, 2007, http://www.chemicalbook.com/ChemicalProductProperty_EN_CB0356004.htm.*
Hamilton, Donny L., Adhesives and Consolidants, Conservation Research Laboratory, 2000, http://nautarch.tamu.edu/crl/conservationmanual/File2.htm.*
English language Office Action dated May 7, 2010 in counterpart European Application No. 04727372.7.

* cited by examiner

*Primary Examiner* — Mark A Osele
*Assistant Examiner* — Nickolas Harm
(74) *Attorney, Agent, or Firm* — Connolly Bove Lodge & Hutz LLP

(57) ABSTRACT

It is an object of the invention to provide a separation method of an adherend capable of easily and reliably separating an adherend stuck using an adhesive, a method for recovering an electronic part from an electronic part laminate, and a separation method of laminate glass.

The invention provides a separation method of an adherend, which is a method of separating an adherend stuck by using an adhesive, and comprises the steps of: air-tightly sealing the adherend together with a fluid being a gas at a normal temperature and normal pressure in a pressure resistant container, making the inside of the pressure resistant container in a high pressure state, and releasing the pressure of the inside of the pressure resistant container.

16 Claims, No Drawings

METHOD FOR RELEASING ADHERED ARTICLE

TECHNICAL FIELD

The invention relates to a separation method of an adherend capable of easily and reliably separating an adherend stuck using an adhesive, a method for recovering an electronic part from an electronic part laminate, and a separation method of laminate glass.

BACKGROUND ART

Adhesives have been used in adhesion of any kinds of materials, e.g. plastics, glass, metals, wood, ceramics, rubber, paper, cloths, leather, and the like. Recently, in terms of recycling, it has been required to separate adherends once stuck with adhesives and reuse them. However, depending on the types of adhesives and the properties and shapes of the adherends, it has not been easy to separate adherends. Especially, in the case the adhesive strength is firm or in the case a fragile adherend has to be separated without being damaged, very complicated operation is required.

For example, a laminate glass, which is obtained by sandwiching an adhesive or an intermediate film for laminate glass made of a thermoplastic resin sheet such as a polyvinyl butyral resin sheet between glass plates and bonding them together, has been used widely as glass for vehicles such as automobiles and aircrafts or for window glass of constructions for preventing scattering of glass, injuries and damages on human bodies and appliances by glass in the case of collision of an object to the glass or for preventing crimes. With respect to such a laminate glass, it has been required to reuse the glass and the intermediate film for laminate glass by disassembling the used laminate glass in terms of recycling. Further, for example, extremely strict quality standards have been imposed on adherends to be used for automobiles and air crafts, those in which foams are entrained at the time of lamination of the glass are regarded as inferior products. Especially in the case of a front glass having a large surface area, such entrainment of foams tends to occur easily and taking the use amount of the laminate glass all over the world into consideration, it can be assumed that an immense amount of inferior products are produced. To recovery the glass and intermediate films for glass from such inferior products is very important and challenging issue in terms of saving cost and advantageous utilization of resources.

For that matter, Japanese Kokai Publication 2001-104928 discloses a method of reusing glass fragments peeled off the adhesive by crushing a laminate glass into small pieces. However, in the case of using this method, a large quantity of adhesive bearing glass fragments and an intermediate film for laminate glass are left, and the object matter to reproduce them is not solved. The adhesive bearing glass fragments and the intermediate film for laminate glass cannot be incinerated in a general incinerator and they cannot be treated but incinerated by employing a special furnace.

Japanese Kokai Publication Hei-6-247751 discloses a method of respectively separating and recovering an inner plate and an outer plate by heating a laminate glass to a temperature at which the intermediate film for laminate glass is softened. However, even by this method, actually it is not easy to carry out the separation in the case of glass with a large size such as automotive front glass and there is a problem left that the adhesive remains in the surface of the glass.

Japanese Patent No. 3137504 describes a method of separating an intermediate film for a laminate glass from the laminate glass by putting the laminate glass crushed in small pieces in a water tank, while swelling the intermediate film, and simultaneously applying shearing force to the intermediate film by stirring the small pieces with specified speed difference. However, although it is possible for this method to reuse the glass portions, it is impossible for the intermediate film portions to be completely separated from the crushed glass fragments and therefore, it is a problem of the quality to reuse them as an intermediate film for laminate glass as they are and the intermediate film portions have to be disposed as industrial wastes.

Japanese Kokai Publication Hei-6-219793 discloses a method involving cooling a laminate glass to −10° C. or lower for decreasing the adhesive strength between the interlayer film for laminate glass and glass and then applying an impact the adherend for crushing the glass and at the same time separating and recovering the interlayer film for laminate glass. However, this method is incomplete in the separation of the glass and interlayer film for laminate glass and there still remains a problem of the quality of the glass and the interlayer film for laminate glass for reuse as they are and they have to be disposed as industrial wastes.

Japanese Kokai Publication 2003-160668 and 2003-285042 disclose methods of removing interlayer films for a laminate glass from glass by immersing laminate glass crushed into small pieces in organic solvents and thereby dissolving the laminate glass.

However, by these methods, it costs high to recover the components of the interlayer film for laminate glass from the organic solvents and to reuse them and further there is another problem that the methods have risks of heavy loads on the environments since a large quantity of organic solvents are used.

Further, electronic materials comprising electronic part laminates composed by layering electronic parts at a high integration degree have been used widely. Adhesives have been employed for connection of these electronic parts. However, even if it is tried to recover and recycle electronic parts from electronic part laminates or it is tried to re-fabricate them in the case defective failure occurs during fabrication process, it has been very difficult to remove the electronic parts stuck to adhesives. For example, Patent Document No. 3 discloses a semiconductor device comprising a semiconductor element stuck to a substrate by previously forming a hole smaller than the outer shape of the semiconductor element in a semiconductor element mounting part of the semiconductor element mounting substrate, providing an adhesive on the substrate having the semiconductor element mounting part, and disposing the semiconductor element on the adhesive. It aims to make adhesion strength weak and make recovery easy by suppressing the adhesion portions of electronic parts to the minimum. However, such a method has a restriction in the position to form the hole therein and results in cost up and further there is a serious disadvantage that the strength of the electronic part laminate to be obtained becomes weak. As a result, electronic part laminates could not have been treated but discarded entirely so far.

Further, also in the case of recovering and recycling paper from books which are produce by binding with adhesives and collected as wastepaper, separation of paper and adhesives becomes a challenging matter. Japanese Kokai Publication Hei-6-080945 discloses a method of removing an adhesive from books by using an adhesive easy to remove by a filter since it has a high strength and cannot be cut by a pulper. However, since this method is limited in the types of adhesives usable, the method is not suitable for recycling of a wide range of books.

Recovery and re-use of steel cans is also very important, however conventionally there is no means but incineration of coating resins as disclosed in Japanese Kokai Publication Hei-9-227957 and even such a method has problems that it is difficult to completely burn out the coating resin and that residues of carbonized coating resins are left.

Japanese Kokai Publication 2002-343760 has a description of a method of physically and chemically removing organic polymer substances adhering or deposited on objects to be washed by spraying water or a polar solvent in supercritical or subcritical state under high pressure atmosphere. However, in this method, water or a polar solvent in supercritical or subcritical state cannot be sprayed directly to organic polymer substances formed thin between two pieces of an object to be washes or to organic polymer substances adhering to an object to be washed having complicated shape and therefore, there is a problem that the application of the method is considerably limited in a very narrow range.

SUMMARY OF THE INVENTION

The invention aims to provide a separation method of an adherend capable of easily and reliably separating an adherend stuck using an adhesive.

The invention relates to a separation method of an adherend, which is a method of separating an adherend stuck by using an adhesive, and comprises the steps of: air-tightly sealing the adherend together with a fluid being a gas at a normal temperature and normal pressure in a pressure resistant container, making the inside of the pressure resistant container in a high-pressure state, and releasing the pressure of the inside of the pressure resistant container.

The fluid which is a gas at a normal temperature and normal pressure is preferably at least one substance selected from the group consisting of air, carbon dioxide, nitrogen, oxygen, methane, ethane, propane, and butane, and more preferably contains at least carbon dioxide.

In the step of air-tightly sealing the adherend together with the fluid being a gas at a normal temperature and normal pressure in the pressure resistant container, it is preferable that water is further sealed in the pressure resistant container and it is more preferable that a release agent is further sealed.

In the step of making the inside of the pressure resistant container in the high pressure state, it is preferable that the inside of the pressure resistant container is adjusted to be 0.5 Mpa or higher, more preferably 5 MPa or higher, and it is even more preferable that the at least one kind of the fluid being a gas at a normal temperature and normal pressure is adjusted to be in supercritical state or subcritical state. Also, in the step of making the inside of the pressure resistant container in the high pressure state, it is preferable that the inside of the pressure resistant container is adjusted to be a temperature higher than a temperature 20° C. lower than a glass transition temperature of a resin composing the adhesive.

In the step of releasing the pressure of the pressure resistant container, the pressure is preferable to be release steeply.

Another aspect of the invention is a method of recovering an electronic part from an electronic part laminate, which is a method of recovering an electronic part from an electronic part laminate stuck by an adhesive, and comprises the steps of: air-tightly sealing the electronic part laminate together with a fluid being a gas at a normal temperature and normal pressure in a pressure resistant container; making the inside of the pressure resistant container in a high pressure state; and releasing the pressure of the inside of the pressure resistant container.

Another aspect of the invention is method for separating a laminate glass, which is a method for separating a laminate glass obtained by sticking a plurality of glass sheets with an adhesive or an interlayer film for the laminate glass into glass sheets and either the adhesive or an interlayer film for laminate glass, and comprises the steps of: air-tightly sealing the laminate glass together with a fluid being a gas at a normal temperature and normal pressure in a pressure resistant container; making the inside of the pressure resistant container in a high pressure state; and releasing the pressure of the inside of the pressure resistant container.

Another aspect of the invention is a recovery method of indium-doped tin oxide fine particles from a laminate glass, which comprises the step of: firing an interlayer film for laminate glass recovered by the separation method of laminate glass of the invention.

DETAILED DESCRIPTION OF THE INVENTION

Hereinafter, the invention will be described in detail.

A separation method of an adherend of the invention is a method of separating an adherend stuck by using an adhesive and comprises the steps of: air-tightly sealing the adherend together with a fluid being a gas at a normal temperature and normal pressure in a pressure resistant container, making the inside of the pressure resistant container in a high pressure state, and releasing the pressure of the inside of the pressure resistant container.

Based on the results of various investigations, the present inventors have found that an adherend can completely separated without adhesive deposit and the like by keeping the adherend together with a fluid which is a gas at a normal temperature and normal pressure in a high pressure condition and then releasing the pressure.

A fluid in the high pressure state, especially a fluid in the supercritical state or subcritical state can easily penetrate the adhesive sticking the adherend. It is supposed that if the pressure is released in the state, the volume of the fluid that penetrates the adhesive as described is changed in the adhesive and following the volume alteration, stress is caused between the adherend and the adhesive and owing to the stress, the separation is carried out.

As an embodiment of decreasing the adhesion strength between the adherend and adhesive, the following embodiments are supposed to be possible; an embodiment of decreasing the adhesion surface area of the adhesive and adherend by foaming the above-mentioned adhesive; an embodiment of decreasing the adhesive strength owing to that the adhesive is swollen even though foaming is not carried out; and an embodiment of releasing the swollen fluid as a gas to the adhesion interface and separating at least a portion of an adhesive face owing to the gas. Actually, these embodiments seem to take place in combination.

It is supposed that which of the above-mentioned embodiments can actually decrease the adhesion strength mainly depends on the modulus of elasticity of the adhesive at the time of releasing the pressure. That is, if the modulus of elasticity of the adhesive is high at the time of releasing the pressure, the swollen fluid cannot be foamed and released to the outside of the adhesive as a gas to separate at least a portion of the adhesive face. On the other hand, if the modulus of elasticity of the adhesive is low at the time of releasing the pressure, the swollen fluid foams or swells the adhesive to decrease the adhesion surface area of the adhesive and the adherend. However, in the case the modulus of elasticity of the adhesive is too low, gas leakage takes place to fail in foaming or even if foaming is caused, the stress generated in the adhesive interface may be soon relaxed in some cases. Since the modulus of elasticity of the adhesive considerably changes in accordance with the temperature, it is supposed to be possible that which embodiment should be employed among the above-mentioned embodiments can be determined mainly based on the setting of the temperature at the time of releasing pressure.

The adherend to be subjected to the separation method of an adherend of the invention is not particularly limited so long as it is bonded by an adhesive, and in the case it has a complicated shape or is fragile, the separation method of an adherend of the invention is particularly effective. Examples of such an adherend are laminate glasses, electronic part laminates, liquid crystal display apparatuses bonded by a sealing agent, various kinds of domestic electric appliances, and construction materials. The above-mentioned electronic part laminates include stack type semiconductors and layered substrates and the electronic parts to be recovered include wafers, chips, and substrates. Further, coating materials of beverage cans which can not be treated by any other method but firing and even adhesives for producing books which are obstacles for reuse of pulp can be separated.

The adhesive to be used for bonding in the above-mentioned adherend is not particularly limited and examples are those comprising base resins having no adhesion property and plasticizers; those comprising thermoplastic resins as adhesive components; those comprising curable resins as the adhesive components; and those comprising elastomers as the adhesive components.

In the case the adhesive comprises a base resin having no adhesive property and a plasticizer giving the adhesive property, the above-mentioned base resin is not particularly limited so long as it is a thermoplastic resin having a glass transition temperature of 40° C. or higher and made to have a glass transition temperature of 40° C. or lower by addition of a plasticizer, and examples are polyvinyl butyral resins, polyvinyl acetal resins, polyurethane resins, ethylene-vinyl acetate resins, ethylene-ethyl acrylate resins, polyvinyl alcohols with a high molecular weight and a high saponification degree, poly(meth)acrylic acid esters, and polyester type resins.

The above-mentioned plasticizer is not particularly limited and for example, in the case the above-mentioned base resin is a polyvinyl butyral resin, a polyvinyl acetal resin, a polyurethane resin, an ethylene-vinyl acetate resin, or an ethylene-ethyl acrylate resin, triethylene glycol-di-2-ethylbutylate, triethylene glycol-di-2-ethylhexanoate, and triethylene glycol-di-2-heptanoate may preferably be used. Also, in the case the base resin is a polyester resin, for example, hydroxyl-containing aliphatic compounds, hydroxyl-containing aromatic compounds, glycidyl-containing aliphatic compounds, and glycidyl-containing aromatic compounds may preferably be used. Plasticizers suitable for the polyester resin may be monomers, oligomers, or polymers, and the hydroxyl group and the glycidyl group may exist at any positions in the terminals of the molecular skeletons, the side chains and the inside of the molecular skeletons. The number of the hydroxyl group and the glycidyl group are each preferably one or more per one molecule and more preferably two or more.

The above-mentioned aliphatic hydroxyl-containing compounds are not particularly limited and may include polyhydroxyalkanes, polyoxyalkylene glycols comprising an alkylene group having 2 to 4 carbon atoms such as alkylene glycol, long chain polyols comprising polytetramethylene ether glycol, hydroxyl-terminated polyalkadienes, polyethylene glycol adducts (1 to 30 carbon atoms) of bisphenol A, polyethylene glycol adducts (1 to 30 carbon atoms) of bisphenol A, hydroxyl-terminated polyesters other than the above-mentioned polyester resins, hydroxyl-terminated polycaprolactones, hydroxyl-terminated polycarbonates, acryl polyols, partially saponified compounds of ethylene-vinyl acetate copolymers, polyvinyl alcohols, castor oil, ketone resins, xylene resins, and their copolymers with hydroxyl-containing aliphatic or aromatic compounds. They may be used alone or in combinations of two or more of them.

The above-mentioned glycidyl-containing compounds may include bisphenol type epoxy resins such as bisphenol A type epoxy resins, bisphenol F type epoxy resins, bisphenol AD type epoxy resins, and bisphenol S type epoxy resins; phenol novolac type epoxy resins; aromatic epoxy resins such as trisphenolmethane triglycidyl ethers and their hydrogenated products or bromides; alicyclic epoxy resins such as 3,4-epoxycyclohexylmethyl-3,4-epoxycyclohexanecarboxylate, 3,4-epoxy-2-methylcyclohexylmethyl-3,4-epoxy-2-methylcycloh exanecarboxylate, bis(3,4-epoxycyclohexyl)adipate, bis(3,4-epoxycyclohexylmethyl)adipate, 2-(3,4-epoxycyclohexyl-5,5-spiro-3,4-epoxy)cyclohexanone-meth-dioxane, and bis(2,3-epoxycyclopentyl)ether (trade name: EHPH-3150, manufactured by Daicel Chem. Ind., Ltd.); and aliphatic epoxy resins such as diglycidyl ethers of 1,4-butanediol, diglycidyl ethers of 1,6-hexanediol, triglycidyl ethers of glycerin, triglycidyl ethers of trimethylolpropane, diglycidyl ethers of polypropylene glycol, and polyglycidyl ethers of polyols, e.g. polyoxyalkylene glycol comprising an alkylene group having 2 to 9 (preferably 2 to 4) carbon atoms and polytetramethylene ether glycol. Additionally, molecules obtained by replacing the glycidyl groups of the above-mentioned epoxy compounds with polyethylene oxides having 1 to 30 (preferably 2 to 16) carbon atoms may also be used as a plasticizer. Examples may further include various kinds of epoxy group-containing compounds such as glycidyl ester ester type epoxy resins and their hydrides such as phthalic acid diglycidyl ester, tetrahydrophthalic acid diglycidyl ester, hexahydrophthalic acid diglycidyl ester, diglycidyl-p-oxybenzoic acid, glycidyl ether glycidyl ester of salicylic acid, and glycidyl esters of dimer acids; glycidylamine type epoxy resins and their hydrides such as N,N'-diglycidyl derivatives of cyclic alkyleneurea, N,N,O-triglycidyl derivatives of p-aminophenol, and N,N,O-triglycidyl derivatives of m-aminophenol; copolymers of glycidyl (meth)acrylate and radical-polymerizable monomers such as ethylene, vinyl acetate, and (meth) acrylic acid esters; polymer compounds obtained by epoxylating double bonds, unsaturated carbon bonds of polymers mainly containing conjugated diene compounds or their partially hydrated polymers such as epoxylated polybutadiene; polymer compounds obtained by epoxylating double bonds, unsaturated carbon bonds of conjugated diene compounds of block copolymers having "polymer blocks mainly containing vinyl aromatic compounds" and "polymer blocks mainly containing conjugated diene compounds or their partially hydrogenated polymer blocks" in its molecule such as epoxylated SBS; polyester resins having one or more in one molecule; urethane-modified epoxy resins and polycaprolactone-modified epoxy resins obtained by introducing urethane bonds or polycaprolactone bonds into the structures of the above-mentioned various epoxy group-containing compounds; and rubber-modified epoxy resins obtained by adding rubber components such as NBR, CTBN, polybutadiene, acrylic rubber into the above-mentioned various epoxy group-containing compounds.

The adhesive comprising such a base resin having no adhesive property and a plasticizer may include a solvent type adhesive. For example, an aqueous polyvinyl alcohol solution can be supposed to be obtained by adding an adhesive comprising polyvinyl alcohol as the base resin and water as the plasticizer.

In the case the above-mentioned adhesive contains a thermoplastic resin as an adhesive component, the thermoplastic resin is not particularly limited if it has a glass transition temperature of 40° C. or lower and examples may include vinyl resins such as polyvinyl acetate, polyvinyl alcohol, polyvinyl chloride, and polyvinyl butyral; acrylic resins such as poly(meth) acrylic acid and poly(meth)acrylic acid ester; polyester resins, nitrocellulose, and starch which satisfy the above-mentioned condition.

In the case the above-mentioned adhesive contains a curable resin as an adhesive component, the curable resin is not particularly limited and examples are phenol resins, resorcin resins, furan resins, urea resins, melamine resins, polyester resins, polyurethane resins, epoxy resins, and silicone resins.

In the case the above-mentioned adhesive contains an elastomer as an adhesive component, the elastomer is not particularly limited, and examples are natural rubbers and besides, synthetic rubbers such as butadiene acrylonitrile rubbers, styrene-isoprene-styrene resins, styrene-ethylene-butadiene-styrene type resins, ethylene-propylene rubbers, and styrene-butadiene-styrene type resins. These rubbers may be hydrogenated. Further, these rubbers may be provided with flexibility by adding a platicizer.

The separation method of the adherend of the invention comprises a step of sealing the adherend together with a fluid which is a gas at a normal temperature and normal pressure in a pressure resistant container.

As the fluid which is a gas at a normal temperature and normal pressure is not particularly limited, however it is preferable that the fluid is at least one fluid selected from the group consisting of air, carbon dioxide, nitrogen, oxygen, methane, ethane, propane, and butane. Among them, carbon dioxide has a critical point relatively close to a normal temperature and is therefore capable of treating the adherend in highly dense state and for example, carbon dioxide has an excellent capability of penetrating water and a release agent in the adhesive and achieving remarkably high separation efficiency in the case the adhesive uses water and a release agent together. Further, since carbon dioxide is odorless and scarce toxicity and non-combustible, carbon dioxide has a high utilization value even in terms of the safety. Further, even in the case of using a fluid other than carbon dioxide in combination, these excellent properties can be exhibited.

A method of sealing the fluid which is a gas at a normal temperature and normal pressure is not particularly limited and it may be sealed in gas phase, liquid phase or solid phase in the above-mentioned pressure resistant container. For example, in the case of using carbon dioxide as the fluid which is a gas at a normal temperature and normal pressure, carbon dioxide in gas phase or liquid phase may be blown or carbon dioxide in dry ice state may be set.

The sealing amount of the fluid which is a gas at a normal temperature and normal pressure is not particularly limited and may be selected properly in accordance with the capacity of the pressure container to be employed, however it is preferable to seal the fluid in an amount sufficient so as to keep the pressure in the inside of the pressure container be 0.5 MPa or higher when the pressure container is heated to a prescribed temperature.

In the step of sealing the adherend and the fluid which is a gas at a normal temperature and normal pressure in the pressure resistant container, it is preferable to further add water into the pressure resistant container. Use of water in combination makes separation of the adherend easier and more reliable. The water to be used is not particularly limited and normal tap water and distilled water can be used.

The sealing amount of water is not particularly limited, however the lower limit and the upper limit relative to the capacity of the pressure container are preferably 0.01 g/mL and 0.2 g/mL, respectively. If it is less than 0.01 g/mL, it is sometimes impossible to achieve sufficient separation efficiency of the adherend. If it exceeds 0.2 g/mL, it is difficult to make water exist in uniform phase in the pressure container and the condensed phase and non-condensed phase are separated. In this case, the adherend is immersed in the phase separated condensed phase, the separation efficiency is sometimes decreased and therefore, it is required to avoid immersion of the adherend in the condensed phase by some means or to make the water phase existing in a uniform layer.

In the step of sealing the adherend and the fluid which is a gas at a normal temperature and normal pressure in the pressure resistant container, it is preferable to seal further a release agent in the pressure resistant container. Generally, it is difficult to penetrate the inside of the adhesive with the release agent, however since the treatment is carried out in the fluid in high pressure state in the separation method of the adherend of the invention, the release agent solvated in the fluid can penetrate the inside of the adhesive, resulting in a remarkably high separation effect.

The above-mentioned release agent is not particularly limited and examples are surfactants, organic salts generating various ions, inorganic salts generating various ions, chelating compounds, and low molecular weight organic compounds.

The above-mentioned surfactants are not particularly limited and usable examples are anionic type ones such as α-sulfo-fatty acid ester (salts), alkylbenzenesulfonic acid (salts), alkyl ether sulfuric acid ester (salts), and alkylsulfuric acid triethanolamine; cationic type ones such as alkyltrimethylammonium (salts), dialkyldimethylammonium chloride, and alkylpyrimidinium chloride; amphoteric type ones such as alkylcarboxybetaine; and nonionic type ones such as fatty acid diethanolamide, polyoxyethylene alkyl ether, and polyoxyethylene alkylphenyl ether.

The above-mentioned organic salts or inorganic salts generating various ions are not particularly limited and examples are salts of organic acids such as carboxylic acids such as octylic acid, hexylic acid, butyric acid, acetic acid, and formic acid or inorganic acids such as phosphoric acid, sulfuric acid, nitric acid, and hydrochloric acid with alkali metals or alkaline earth metals such as potassium, sodium, and magnesium. As the above-mentioned alkali metal salts and alkaline earth metal salts, alkali metal salts and alkaline earth metal salts of organic acids having 5 to 16 carbon atoms are preferable and magnesium salts of carboxylic acids or dicarboxylic acids having 6 to 10 carbon atoms are more preferable. The magnesium salts of carboxylic acids or dicarboxylic acids are not particularly limited and examples are magnesium 2-ethylbutyrate, magnesium valerate, magnesium hexanoate, magnesium butanate, magnesium octanoate, magnesium nonanate, magnesium decanate, magnesium glutarate, and magnesium adipate.

The above-mentioned chelating compounds are not particularly limited and examples are carboxylic acid (salts) such as ethylenediaminetetraacetic acid (salts), nitrilotriacetic acid (salts), and hydroxyliminodiacetic acid (salts); hydrogen-containing compounds; phosphonic acid compounds such as hydroxyethylidene diphosphoric acid; and β-diketones. Among them, the β-diketones are excellent in compatibility with the plasticizer and the resin to be used for intermediate agent for the adherend and are therefore preferable. Preferable examples of the β-diketones are acetylacetone, benzoyltrifluoroacetone, and dipivaloylmethane.

The above-mentioned low molecular weight organic compounds are not particularly limited and examples are fluorine-containing compounds, silicon-containing compounds such as silicone oil; and alcohols. However, in the case of using alcohols, if a large amount of an alcohol is used, the adhesive is dissolved owing to the alcohol and the separation efficiency is adversely decreased and therefore it should be used carefully.

In the case the above-mentioned adhesive component of the adhesive contains a hydrophilic group such as a hydroxyl, an ester, an amino, and a carbonyl, water can work as an effective release agent.

These release agents may be used alone or two or more of them may be used in combination.

The pressure resistant container is not particularly limited if it has sufficient pressure resistance and those made of metals, autoclaves, and rubber bags can be used. Further, it is also possible to carry out batch treatment by putting an adherend separately sealed in a plurality of containers and setting the container in an autoclave.

The separation method of the adherend of the invention comprises a step of making the inside of the pressure resistant container in a high pressure state. The pressure in this case may adequately be selected depending on the types of the adhesive and the interlayer film for laminate glass, however as the pressure becomes higher, the separation can be completed within a shorter time and therefore, it is preferable. A preferable lower limit is 0.5 MPa. If it is lower than 0.5 MPa, it takes long time to penetrate the adhesive with the fluid, water, and the releasing agent to result in low efficiency or insufficient penetration of the adhesive with the fluid and accordingly failure of separation. A more preferable lower limit is 5 MPa. In the case pressure of 5 MPa or higher is applied, the separation can be completed within a short time for a wide range of adherends.

The temperature at that time is preferable to be kept at a temperature higher than a temperature lower than a glass transition temperature of the adhesive by 20° C. If the temperature is lower than that, it sometimes takes a long time to penetrate the adhesive with the fluid. It is more preferable that a temperature is higher than a temperature 10° C. lower than the glass transition temperature of the resin composing the adhesive. The upper limit of the temperature is not particularly limited and may be set to be the optimum in accordance with the type of the adhesive, however if the temperature becomes high, the density of the fluid is lowered or the affinity of the adherend and the adhesive is heightened to result in deterioration of the penetration of the adhesive with the fluid and accordingly decrease of the separation efficiency. In the case of a common adhesive, the upper limit is preferably 150° C. and the lower limit is more preferably 100° C. In this connection, if the adhesive is a crosslinking type or a crystalline type, that is not necessary to be applied.

In the step of making the inside of the pressure resistant container in a high pressure state, at least one kind of fluids which are gases at a normal temperature and normal pressure and contained in the pressure resistant container is preferable to be in the supercritical state or subcritical state. The fluid in the supercritical state or subcritical state is remarkably excellent in penetrating the adhesive and exhibits a high separation effect.

In the description, the supercritical state means the state of conditions of supercritical pressure (hereinafter, referred to as Pc in some cases) or higher and supercritical temperature (hereinafter, referred to as Tc in some cases) or higher. The subcritical state also means the state other than the supercritical state and satisfies the conditions defined as $0.5<P/Pc<1.0$ and $0.5<T/Tc$, or $0.5<P/Pc$ and $0.5<T/Tc<1.0$ in the case P represents the pressure and T represents temperature at the time of reaction. The ranges of the pressure and the temperature in the above-mentioned subcritical state are preferably $0.6<P/Pc<1.0$ and $0.6<T/Tc$, or $0.6<P/Pc$ and $0.6<T/Tc<1.0$. The temperature is based on centigrade and in the case either Tc or T is minus based on centigrade, the temperature is assumed to satisfy the subcritical state and in the case the pressure satisfies $0.5<P/Pc$, it is assumed that the subcritical state is produced.

The method of making the inside of the pressure resistant container in a high pressure state is not particularly limited and examples are a method of blowing a fluid until the pressure reaches a prescribed level or higher at the time of sealing the fluid in gas phase and a method of once sealing the fluid and then further heating the fluid.

In the separation method of the adherend of the invention, physical force such as vibration of the pressure resistant container and ultrasonic radiation may be applied under the condition of keeping the inside of the pressure resistant container high. Application of the physical force further promotes separation of the adherend.

The separation method of the adherend of the invention comprises a step of releasing the pressure of the inside of the pressure resistant container. Herein, releasing the pressure means that the pressure in the inside of a container in a high pressure state is lowered. In consideration of the step thereafter, it is preferable to release pressure to a normal pressure. The releasing pressure may be carried out by cooling the container and gradually releasing the pressure or steeply releasing the pressure. In the case of steeply releasing the pressure, the volume of the fluid penetrating the adhesive is sharply expanded to generate high stress in the adhesion interface, so that the adhesion strength can further be lowered. A method of steeply releasing the pressure is not particularly limited and a method of releasing a valve connected to the container can be exemplified.

The step of releasing the pressure of the inside of the pressure resistant container is preferable to be carried out at a temperature lower than a 10° C. higher temperature than the glass transition temperature of the adhesive. If releasing of the pressure is carried out at a temperature not lower than that, the modulus of elasticity of the adhesive is low and gas leakage takes place to result in decrease of the separation efficiency in some cases. In this connection, if the adhesive is a crosslinking type or a crystalline type, that is not necessary to be applied. The lower limit of the temperature is not particularly specified, however it is preferable that the step is carried out at a temperature higher than a temperature 25° C. lower than the glass transition temperature of the adhesive. If the pressure is released at a temperature not higher than that, the modulus of elasticity of the adhesive is too high to obtain sufficient separation force and it results in decrease of the separation efficiency.

In the separation method of the adherend of the invention, the type of fluids, the temperature and pressure at the time of pressure application, the duration of making the pressure in the inside of the pressure resistant container high, and the method of releasing the pressure are properly selected so as to carry out separation of the adherend in various states. These conditions may adequately be selected in accordance with the type of the adherend, the type of the adhesive, and the purpose of the separation.

For example, in the case the adhesive comprises a base resin having no adhesion property and a plasticizer giving an adhesion property, the plasticizer which is a low molecular weight substance can be dissolved in a fluid to make the adhesive lose the adhesive property without decomposing the base resin and thus the adherend can be separated and at the time the base resin can be recovered and recycled by selecting carbon dioxide as the fluid and carrying out the treatment at a relatively low temperature for a long time.

Further, for example, in the case the adherend having high heat resistance is recovered, water is used in combination to carry out the treatment at a high temperature and high pressure, so that at least one component of the adhesive can be decomposed and the low molecular weight substance can be dissolved in the fluid to make the adhesive lose the adhesive property and the adherend can be separated.

As a decomposition promoting agent, for example, peroxy acid such as hydrogen peroxide, and peracetic acid; persulfates such as ammonium persulfate, sodium persulfate, and potassium persulfate; sodium percarbonates (salts) such as sodium carbonate adduct of hydrogen peroxide; and peroxy-containing peroxides such as diisopropyl peroxide may be used in combination. Further, various kinds of acid catalysts and alkali catalysts may be used. This method is suitable in the case the adherend is fragile since no physical impact is applied to the adherend.

Further, in the case the adhesive is difficult to be decomposed, the adhesive is impregnated with the fluid and then the pressure is steeply released, so that the adhesive is foamed to lose the adhesive property and separate the adherend.

The pressurizing process and the pressure-releasing process may be carried out repeatedly a plurality of times based on the necessity.

According to the separation method of the adherend of the invention, even if the adherend has a complicated shape or is fragile, it can easily and reliably be separated as long as the adherend is produced by sticking with an adhesive. Further, since the separation method of the adherend of the invention scarcely requires an organic solvent, there is no risk of elution of a plasticizer contained in the adhesive into the solvent and the load on the environments is remarkably slight.

According to the separation method of the adherend of the invention, for example, laminate glasses, electronic part laminates, liquid crystal display apparatuses bonded by a sealing agent, various kinds of domestic electric products, and construction materials can be separated and recovered and recycled. Among them, with respect to the electronic part laminates and laminate glasses, the social demands for recycling them are considerable high.

Another embodiment of the invention is a method of recovering an electronic part from an electronic part laminate stuck by an adhesive, comprising the steps of air-tightly sealing the electronic part laminate together with a fluid which is a gas at a normal temperature and normal pressure in a pressure resistant container, making the inside of the pressure resistant container in a high pressure state, and releasing the pressure of the inside of the pressure resistant container.

Another embodiment of the invention is a separation method of laminate glass for separating a laminate glass obtained by sticking a plurality of glass sheets with an adhesive or an interlayer film for the laminate glass into glass sheets and either the adhesive or the interlayer film for the laminate glass, comprising the steps of air-tightly sealing the laminate glass together with a fluid which is a gas at a normal temperature and normal pressure in a pressure resistant container, making the inside of the pressure resistant container in a high pressure state, and releasing the pressure of the inside of the pressure resistant container.

The laminate glass to be subjected to the separation method of the laminate glass of the invention may include a single large sheet of laminate glass to be used as glass for vehicles, small pieces obtained by cutting laminate glass by a cutter or the like, and small fragments obtained by crushing laminate glass by a crusher or the like. Also, an interlayer film for laminate glass bearing a large number of glass pieces which is left after the glass portion of the laminate glass is crushed and the glass is recovered and laminate glass whose surface is cracked to form cracks reaching deep to the interlayer film for laminate glass may be subjected to the separation method. In the case a single sheet is used, the recovered glass and intermediate film can be use as they are recovered. In the case small pieces and the interlayer film for laminate glass bearing glass pieces are used, a pressure container with a relatively small capacity can be used and a large quantity of laminate glass can efficiently be treated within a short time.

In the case cut or crushed small pieces are subjected as the laminate glass, after the separation is carried out by the separation method of the laminate glass of the invention, a mixture of the obtained glass and either the adhesive or the interlayer film for laminate glass may be immersed in water. Since the glass has quite different density from that of the adhesive or the interlayer film for laminate glass, the glass is precipitated in the bottom and on the other hand, the adhesive or the interlayer film for laminate glass which contains a resin as a main component is floated. Accordingly, the floating resin component can remarkably easily be separated by a method of collecting them.

According to the separation method of the laminate glass of the invention, the laminate glass can be separated into glass and either the adhesive or the interlayer film for laminate glass. The obtained glass and interlayer film for laminate glass are completely separated from each other, so that they can be made reusable by recycling them as they are. Especially, in the case a single sheet of the adherend is used as it is, the recovered glass and the interlayer film for laminate glass can be made reusable as they are.

Further, even in the case of using an interlayer film for laminate glass containing metal fine particles just like a heat shielding interlayer film, the metal fine particles can be recovered separately from glass and prevented from contamination at the time of recovery. Among metal fine particles, since indium-doped tin oxide fine particles are highly valuable and therefore, recovery and recycling of them is very important in an economical viewpoint. A method of recovering the indium-doped tin oxide fine particles is not particularly limited, however a method of firing the interlayer film for laminate glass recovered by the separation method of the laminate glass of the invention is preferable. Since the components derived from glass are not at all mixed in the residues after firing, indium-doped tin oxide fine particles with remarkably high purity can be recovered.

The recovery method of indium-doped tin oxide fine particles from laminate glass by firing the interlayer film for laminate glass recovered by the separation method of laminate glass of the invention is also one of the embodiments of the invention

BEST MODES FOR CARRYING OUT THE INVENTION

Hereinafter, the invention will be described more in details with reference to Examples, however it is not intended that the invention be limited to the illustrated Examples.

Example 1

(1) Production of Laminate Glass

A 0.76 mm-thick polyvinyl butyral resin sheet (a PVB sheet) was obtained by adding and mixing triethylene glycol-di-2-ethylhexanoate (3GO) 41 parts by weight as a plasticizer to and with a polyvinyl butyral resin (average polymerization degree 1700; remaining acetyl group 1 mol %, and butyralization degree 69 mol %) 100 parts by weight, melting and kneading the mixture by an extruder, and extruding the mixture into a sheet-like shape through an extrusion die.

Next, a large number of embosses comprising fine hill-like projections and recessions were formed in both faces of the obtained PVB sheet by using a pair of emboss rolls to obtain an interlayer film for a laminate glass having embossed patterns in both faces. The obtained interlayer film for laminate glass was left in ambient environments of a temperature of 20 to 25° C. and a humidity of 25 to 30% RH for 2 hours for moisture adjustment.

Next, the obtained interlayer film for laminate glass was sandwiched between two sheets of transparent inorganic flat glass (10 cm square and 1 mm thickness) to obtain a glass composite (laminate) which was put in a rubber bag and pinched by steel plates made of a 5 mm-thick stainless steel for press and the pressure in the rubber bag was reduced to 16 kPa and degassing and vacuum pressing was carried out at 130° C. to produce laminate glass.

(2) Separation of Adherend

After the obtained laminate glass and distilled water 40 g were put in a pressure resistant container with 1 L capacity, carbon dioxide was injected to the pressure resistant container at a normal temperature to the extent that the pressure in the inside of the pressure resistant container reached 25 MPa. The pressure resistant container was heated to 60° C. and carbon dioxide was repeatedly released and pressurized so as to keep the pressure in the inside of the pressure resistant container constantly 25 MPa. The pressure of the inside of the pressure resistant container was kept for 24 hours after the pressure was stabilized at 25 MPa.

After that, the pressure resistant container was cooled to a room temperature and then the pressure was released. When the resulting material state was observed with eyes, the glass and the interlayer film for laminate glass were completely separated from each other.

Example 2

The laminate glass produced in Example 1 was crushed into small pieces using a crusher.

After the crushed small pieces of the obtained laminate glass and distilled water 40 g were put in a pressure resistant container with 1 L capacity, carbon dioxide was injected to the pressure resistant container at a normal temperature to the extent that the pressure in the inside of the pressure resistant container reached 15 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 3

The laminate glass produced in Example 1 was cut into small pieces by a high speed rotary cutter.

After the cut small pieces of the obtained laminate glass and distilled water 40 g were put in a pressure resistant container with 1 L capacity, carbon dioxide was injected to the pressure resistant container at a normal temperature to the extent that the pressure in the inside of the pressure resistant container reached 20 MPa. The pressure resistant container was kept at a normal temperature for 6 hours.

After that, the pressure resistant container was released from the pressure. When the resulting material state was observed with eyes, the glass and the interlayer film for laminate glass were completely separated from each other.

Example 4

The laminate glass produced in Example 1 was crushed by a hummer to cause cracks at about 2 cm intervals in the glass face.

After the laminate glass having cracks and distilled water 40 g were put in a pressure resistant container with 1 L capacity, carbon dioxide was injected to the pressure resistant container at a normal temperature to the extent that the pressure in the inside of the pressure resistant container reached 12 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 5

After the laminate glass produced in Example 1, distilled water 40 g, and as a release agent, acetylacetone 40 mL were put in a pressure resistant container with 1 L capacity, carbon dioxide was injected to the pressure resistant container at a normal temperature to the extent that the pressure in the inside of the pressure resistant container reached 25 MPa. The pressure resistant container was heated to 60° C. and carbon dioxide was repeatedly released and pressurized so as to keep the pressure in the inside of the pressure resistant container constantly 25 MPa. The pressure of the inside of the pressure resistant container was kept for 24 hours after the pressure was stabilized at 25 MPa.

After that, the pressure resistant container was cooled to a room temperature and then the pressure was released. When the resulting material state was observed with eyes, the glass and the interlayer film for laminate glass were completely separated from each other.

Example 6

The laminate glass produced in Example 1 was crushed into small pieces by a crusher.

After the crushed small pieces of the obtained laminate glass, distilled water 40 g, and as a release agent, acetylacetone 40 ml were put in a pressure resistant container with 1 L capacity, carbon dioxide was injected to the pressure resistant container at a normal temperature to the extent that the pressure in the inside of the pressure resistant container reached 15 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 7

After the laminate glass produced in Example 1, distilled water 40 g, and as a release agent, a mixed solvent of methanol and butanol 1:1 by volume 40 mL were put in a pressure resistant container with 1 L capacity, carbon dioxide was injected to the pressure resistant container at a normal temperature to the extent that the pressure in the inside of the pressure resistant container reached 25 MPa. The pressure resistant container was heated to 60° C. and carbon dioxide was repeatedly released and pressurized so as to keep the pressure in the inside of the pressure resistant container constantly 25 MPa. The pressure of the inside of the pressure resistant container was kept for 24 hours after the pressure was stabilized at 25 MPa.

After that, the pressure resistant container was cooled to a room temperature and then the pressure was released. When the resulting material state was observed with eyes, the glass and the interlayer film for laminate glass were completely separated from each other.

Example 8

The laminate glass produced in Example 1 was crushed into small pieces by a crusher.

After the crushed small pieces of the obtained laminate glass, distilled water 40 g, and as a release agent, a mixed solvent of methanol and butanol 1:1 by volume 40 mL were put in a pressure resistant container with 1 L capacity, carbon dioxide was injected to the pressure resistant container at a normal temperature to the extent that the pressure in the inside of the pressure resistant container reached 15 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 9

After the laminate glass produced in Example 1, distilled water 40 g, and as a release agent, magnesium acetate 4 g were put in a pressure resistant container with 1 L capacity, carbon dioxide was injected to the pressure resistant container at a normal temperature to the extent that the pressure in the inside of the pressure resistant container reached 12 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 10

The laminate glass produced in Example 1 was crushed into small pieces by a crusher.

After the crushed small pieces of the obtained laminate glass, distilled water 40 g, and as a release agent, magnesium acetate 4 g were put in a pressure resistant container with 1 L capacity, carbon dioxide was injected to the pressure resistant container at a normal temperature to the extent that the pressure in the inside of the pressure resistant container reached 12 MPa. The pressure resistant container was heated to 60° C. and carbon dioxide was repeatedly released and pressurized so as to keep the pressure in the inside of the pressure resistant container constantly 15 MPa. The pressure of the inside of the pressure resistant container was kept for 3 hours after the pressure was stabilized at 15 MPa.

After that, the pressure resistant container was cooled to a room temperature and then the pressure was released. When the resulting material state was observed with eyes, the glass and the interlayer film for laminate glass were completely separated from each other.

Example 11

(1) Production of Laminate Glass

A 0.76 mm-thick polyvinyl butyral resin sheet (a PVB sheet) was obtained by adding and mixing triethylene glycol-di-2-ethylhexanoate (3GO) 41 parts by weight as a plasticizer and indium-doped tin oxide fine particles 1 part by weight to and with a polyvinyl butyral resin (average polymerization degree 1700; remaining acetyl group 1 mol %, and butyralization degree 69 mol %) 100 parts by weight, melting and kneading the mixture by an extruder; and extruding the mixture into a sheet-like shape through an extrusion die.

Next, a large number of embosses comprising fine hill-like projections and recessions were formed in both faces of the obtained PVB sheet by using a pair of emboss rolls to obtain an interlayer film for a laminate glass having embossed patterns in both faces. The obtained interlayer film for laminate glass was left in ambient environments of a temperature of 20 to 25° C. and a humidity of 25 to 30% RH for 2 hours for moisture adjustment.

Next, the obtained interlayer film for laminate glass was sandwiched between two sheets of transparent inorganic flat glass (10 cm square and 1 mm thickness) to obtain a glass composite (laminate) which was put in a rubber bag and pinched by steel plates made of a 5 mm-thick stainless steel for press and the pressure in the rubber bag was reduced to 16 kPa and degassing and vacuum pressing was carried out at 130° C. to produce laminate glass.

The obtained laminate glass was cut into small pieces with 1 cm square by a high speed rotary cutter.

(2) Separation of Adherend

After the obtained small pieces of the laminate glass and distilled water 40 g were put in a pressure resistant container with 1 L capacity, carbon dioxide was injected to the pressure resistant container at a normal temperature to the extent that the pressure in the inside of the pressure resistant container reached 20 MPa. The pressure resistant container was heated to 60° C. and carbon dioxide was repeatedly released and pressurized so as to keep the pressure in the inside of the pressure resistant container constantly 20 MPa. The pressure of the inside of the pressure resistant container was kept for 6 hours after the pressure was stabilized at 20 MPa.

After that, the pressure resistant container was cooled to a room temperature and then the pressure was released. When the resulting material state was observed with eyes, the glass and the interlayer film for laminate glass were completely separated from each other. Further, the separated interlayer film for laminate glass was recovered and fired at 700° C. in an electric furnace to recover indium-doped tin oxide fine particles with extremely high purity as residue.

INDUSTRIAL APPLICABILITY

The invention can provide a separation method of an adherend capable of easily and reliably separating an adherend stuck using an adhesive, a method for recovering an electronic part from an electronic part laminate, and a separation method of laminate glass.

The invention claimed is:

1. A separation method of an adherend, which is a method of separating an adherend stuck by using an adhesive, wherein the adhesive comprises as an adhesive component polyvinyl acetal resins, and comprises the steps of:
air-tightly sealing the adherend together with at least one substance selected from the group consisting of air, carbon dioxide, nitrogen, oxygen, methane, ethane, propane, and butane in a pressure resistant container, making the inside of the pressure resistant container in a high pressure state of 5 MPa or higher, and releasing the pressure of the inside of the pressure resistant container, and wherein water is further sealed in the pressure resistant container in the step of air-tightly sealing the adherend together with said at least one substance in the pressure resistant container, whereby the polyvinyl acetal resins are not dissolved.

2. The separation method of an adherend according to claim 1, wherein the at least one substance contains at least carbon dioxide.

3. The separation method of an adherend according to claim 2, wherein a release agent is further sealed in the step of air-tightly sealing the adherend together with the at least one substance in the pressure resistant container.

4. The separation method of an adherend according to claim 1, wherein a release agent is further sealed in the step of air-tightly sealing the adherend together with the at least one substance in the pressure resistant container.

5. The separation method of an adherend according to claim 1, wherein the at least one substance in the inside of the pressure resistant container is adjusted to be in supercritical state or subcritical state in the step of making the inside of the pressure resistant container in a high pressure state.

6. The separation method of an adherend according to claim 1, wherein the inside of the pressure resistant container is adjusted to be a temperature higher than a temperature 20° C. lower than a glass transition temperature of a resin composing the adhesive in the step of making the inside of the pressure resistant container in a high pressure state.

7. The separation method of an adherend according to claim 1, wherein the inside of the pressure resistant container is adjusted to be a temperature higher than a temperature 10° C. lower than a glass transition temperature of a resin composing the adhesive in the step of making the inside of the pressure resistant container in a high pressure state.

8. A method of recovering an electronic part from an electronic part laminate, which is a method of recovering an electronic part from an electronic part laminate stuck by an adhesive, wherein the adhesive comprises as an adhesive component polyvinyl acetal resins, and comprises the steps of: air-tightly sealing the electronic part laminate together with at least one substance selected from the group consisting of air, carbon dioxide, nitrogen, oxygen, methane, ethane, propane, and butane in a pressure resistant container; making the inside of the pressure resistant container in a high pressure state of 5 MPa or higher; and releasing the pressure of the inside of the pressure resistant container, and wherein water is further sealed in the pressure resistant container in the step of air-tightly sealing the adherend together with said at least one substance in the pressure resistant container.

9. The separation method of an adherend according to claim 8, wherein the at least one substance contains at least carbon dioxide.

10. The separation method of an adherend according to claim 8, wherein the inside of the pressure resistant container is adjusted to be a temperature higher than a temperature 10° C. lower than a glass transition temperature of a resin composing the adhesive in the step of making the inside of the pressure resistant container in a high pressure state.

11. The separation method of an adherend according to claim 8, wherein the at least one substance in the inside of the pressure resistant container is adjusted to be in supercritical state or subcritical state in the step of making the inside of the pressure resistant container in a high pressure state.

12. A method for separating a laminate glass, which is a method for separating a laminate glass obtained by sticking a plurality of glass sheets with an adhesive or an interlayer film for the laminate glass into glass sheets and either the adhesive or an interlayer film for laminate glass, wherein the adhesive or interlayer film comprises as an adhesive component polyvinyl acetal resins, and comprises the steps of: air-tightly sealing the laminate glass together with at least one substance selected from the group consisting of air, carbon dioxide, nitrogen, oxygen, methane, ethane, propane, and butane in a pressure resistant container of 5 MPa or higher; making the inside of the pressure resistant container in a high pressure state; and releasing the pressure of the inside of the pressure resistant container, and wherein water is further sealed in the pressure resistant container in the step of air-tightly sealing the adherend together with said at least one substance in the pressure resistant container.

13. A recovery method of indium-doped tin oxide fine particles from a laminate glass, which comprises the step of: firing an interlayer film for laminate glass recovered by the separation method of laminate glass according to claim 12.

14. The separation method of an adherend according to claim 12, wherein the at least one substance contains at least carbon dioxide.

15. The separation method of an adherend according to claim 12, wherein the inside of the pressure resistant container is adjusted to be a temperature higher than a temperature 10° C. lower than a glass transition temperature of a resin composing the adhesive in the step of making the inside of the pressure resistant container in a high pressure state.

16. The separation method of an adherend according to claim 12, wherein the at least one substance in the inside of the pressure resistant container is adjusted to be in supercritical state or subcritical state in the step of making the inside of the pressure resistant container in a high pressure state.

* * * * *